(12) United States Patent
Lai et al.

(10) Patent No.: US 6,695,041 B2
(45) Date of Patent: Feb. 24, 2004

(54) DOUBLE HEAT EXCHANGE MODULE FOR A PORTABLE COMPUTER

(75) Inventors: Chih-Hsi Lai, Shindian (TW); Hawk Fang, Kaohsiung (TW)

(73) Assignee: Quanta Computer Inc. (TW)

( * ) Notice: Subject to any disclaimer, the term of this patent is extended or adjusted under 35 U.S.C. 154(b) by 0 days.

(21) Appl. No.: 10/178,792

(22) Filed: Jun. 25, 2002

(65) Prior Publication Data

US 2003/0056941 A1 Mar. 27, 2003

(30) Foreign Application Priority Data

Sep. 27, 2001 (TW) ........................................ 90123898 A

(51) Int. Cl.[7] ............................................. F28D 15/00
(52) U.S. Cl. ........................... 165/104.33; 165/104.21; 361/700; 361/687; 174/15.2; 257/715
(58) Field of Search ........................ 165/104.33, 104.26, 165/80.4, 104.21; 361/687, 700; 174/15.2; 257/715

(56) References Cited

U.S. PATENT DOCUMENTS

| | | | | |
|---|---|---|---|---|
| 6,031,721 A | * | 2/2000 | Bhatia | 361/695 |
| 6,288,895 B1 | * | 9/2001 | Bhatia | 361/687 |
| 6,304,441 B1 | * | 10/2001 | Han | 361/687 |
| 6,328,097 B1 | * | 12/2001 | Bookhardt et al. | 165/104.33 |
| 6,357,515 B1 | * | 3/2002 | Bhatia | 165/80.3 |
| 6,407,916 B1 | * | 6/2002 | Konstad | 361/687 |
| 6,408,934 B1 | * | 6/2002 | Ishida et al. | 165/80.3 |
| 6,459,575 B1 | * | 10/2002 | Esterberg | 361/687 |
| 6,459,576 B1 | * | 10/2002 | Bhatia et al. | 361/687 |
| 6,535,386 B2 | * | 3/2003 | Sathe et al. | 361/700 |

FOREIGN PATENT DOCUMENTS

TW          361651          6/1999

* cited by examiner

*Primary Examiner*—Terrell McKinnon
(74) *Attorney, Agent, or Firm*—Rabin & Berdo, PC

(57) ABSTRACT

A double heat exchange module for a portable computer, which is applied to cool an integrated circuit within the portable computer. The double heat exchange module includes a thermally conductive structure, a fan, and a heat exchanger. The thermally conductive structure is coupled with the integrated circuit, for conducting heat from the integrated circuit. The fan facilitates airflow from the air inlet to the air outlet. The heat exchanger disposed at the fan and coupled with the thermal conductive structure is used for double heat transfer and includes an inflow portion located at the air inlet and an outflow portion located at the air outlet.

7 Claims, 3 Drawing Sheets

DOUBLE HEAT EXCHANGE MODULE FOR A PORTABLE COMPUTER

This application incorporates by reference of Taiwan application Serial No. 090123898, filed Sep. 27, 2001.

BACKGROUND OF THE INVENTION

1. Field of the Invention

The invention relates in general to a heat exchange module, and more particularly to a double heat exchange module for a portable computer.

2. Description of the Related Art

Faster and more powerful integrated circuits allow the design and construction of higher performance portable computers such as laptop or notebook computers. Unfortunately, the use of such faster and more powerful integrated circuits, especially for the central processing unit, often results in increased power consumption and heat generation. Thus, improved heat dissipation technology is often needed to maintain operating temperatures of portable computers within the same range as their predecessors or some other acceptable range. Typically, heat exchangers, fans, and heat pipes are employed to dissipate heat from integrated circuits. One prior art method for removing heat from the integrated circuits involves transferring heat to the heat exchangers and using the fan to facilitate the airflow for heat dissipation. Increases in heat generation are often accommodated by simply increasing the quantity or size of these heat dissipation elements. The relatively small size of a portable computer, however, complicates heat dissipation by reducing the space available for heat dissipation elements, presenting particularly difficult design problems from an overall heat dissipation standpoint. Therefore, adequate heat dissipation for the combination of high operating heat generation and low volume has become a major design concern in these more powerful, compact portable computer to ensure performance, reliability, and safety.

Referring to FIG. 1, a conventional design of the heat exchange module for a notebook computer is illustrated. The conventional heat exchange module includes a heat pipe 110, fan 120, and heat exchanger 130. The heat pipe 110 made of high thermal conductivity material is disposed within the notebook computer, forming a contact 111 at one end for being in contact with the central processing unit 100 (or other integrated circuits) for heat transfer. The fan 120 providing airflow is also disposed within the notebook computer. The heat exchange 130 is coupled with the heat pipe 110 and located at the air outlet. The operation of the fan 120 causes air inflow in the air-in direction I and air outflow in the air-out direction O.

The central processing unit 100 generates great operating heat and causes high temperatures while the notebook computer is running. The generated heat is transferred to the heat exchanger 130 by the contact 111 and the heat pipe 110, which are made of high thermal conductivity material. The heat exchanger 130 has a plurality of fins 140 spaced at intervals, allowing airflow from the air outlet to pass through in the air-out direction O for heat transfer and dissipation. The cooling performance of the heat exchange module is subject to the heat transfer area of the fins 140 and the airflow of the fan 120. In order to improve the heat dissipation efficiency, the heat transfer area of the fins 140 can be increased under the presupposition that the design of the fan 120 remains unchanged.

Conventionally, there are two ways to increase the heat transfer area of the fins 140. One way is to increase the amount (or density) of fins 140, and the other way is to extend the length L of the fins 140. Increases in the amount of fins, however, might hinder the air from flowing in and then the noise might be produced. Besides, extending the length L of the fins 140 will increase the volume of the heat exchange module and the friction between the air and the fins 140 will increase to speed up the fan 120 and cause a boundary effect to decrease the heat dissipation efficiency.

SUMMARY OF THE INVENTION

It is therefore an object of the invention to provide a heat exchange module for a portable computer by using double heat transfer to increase the heat transfer area of the heat exchanger in contact with the air for enhancing heat dissipation efficiency.

The invention achieves the above-identified objects by providing a double heat exchange module for a portable computer, which is applied to cool an integrated circuit within the portable computer. The double heat exchange module includes a thermally conductive structure, a fan, and a heat exchanger. The thermally conductive structure is disposed within the portable computer and coupled with the integrated circuit, for conducting heat from the integrated circuit. The fan with an air inlet and air outlet is disposed within the portable computer and facilitates airflow from the air inlet to the air outlet. The heat exchanger disposed at the fan and coupled with the thermal conductive structure is used for double heat transfer. Besides, the heat exchanger includes an inflow portion located at the air inlet and an outflow portion located at the air outlet.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
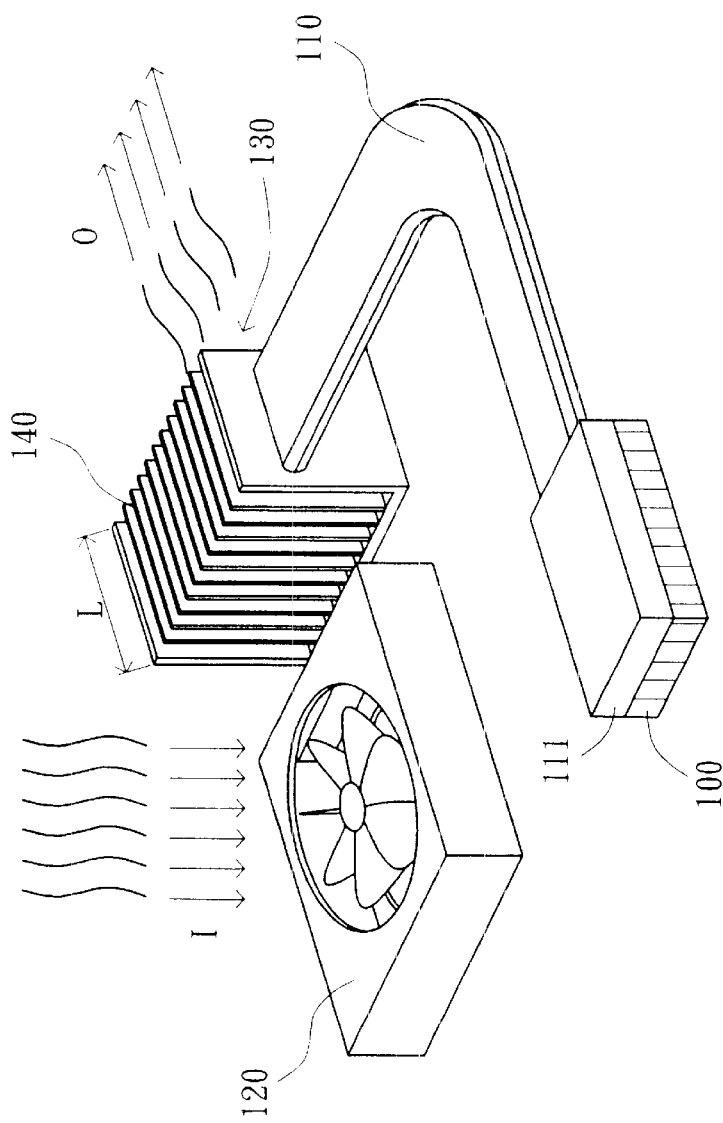
FIG. 1 (Prior Art) illustrates a conventional design of the heat exchange module for a notebook computer.
Figure 2A:
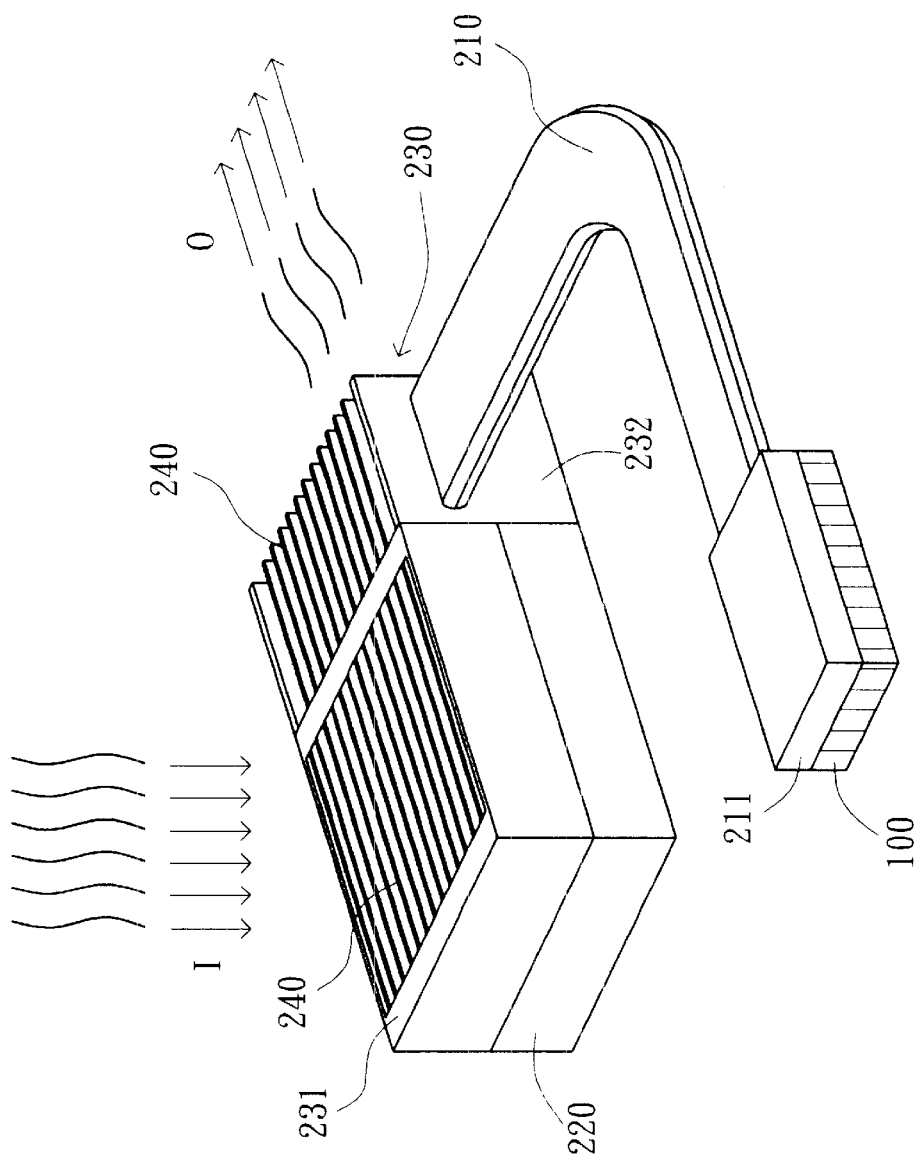
FIG. 2A is a perspective view of a double heat exchange module according to a preferred embodiment of the invention.
Figure 2B:
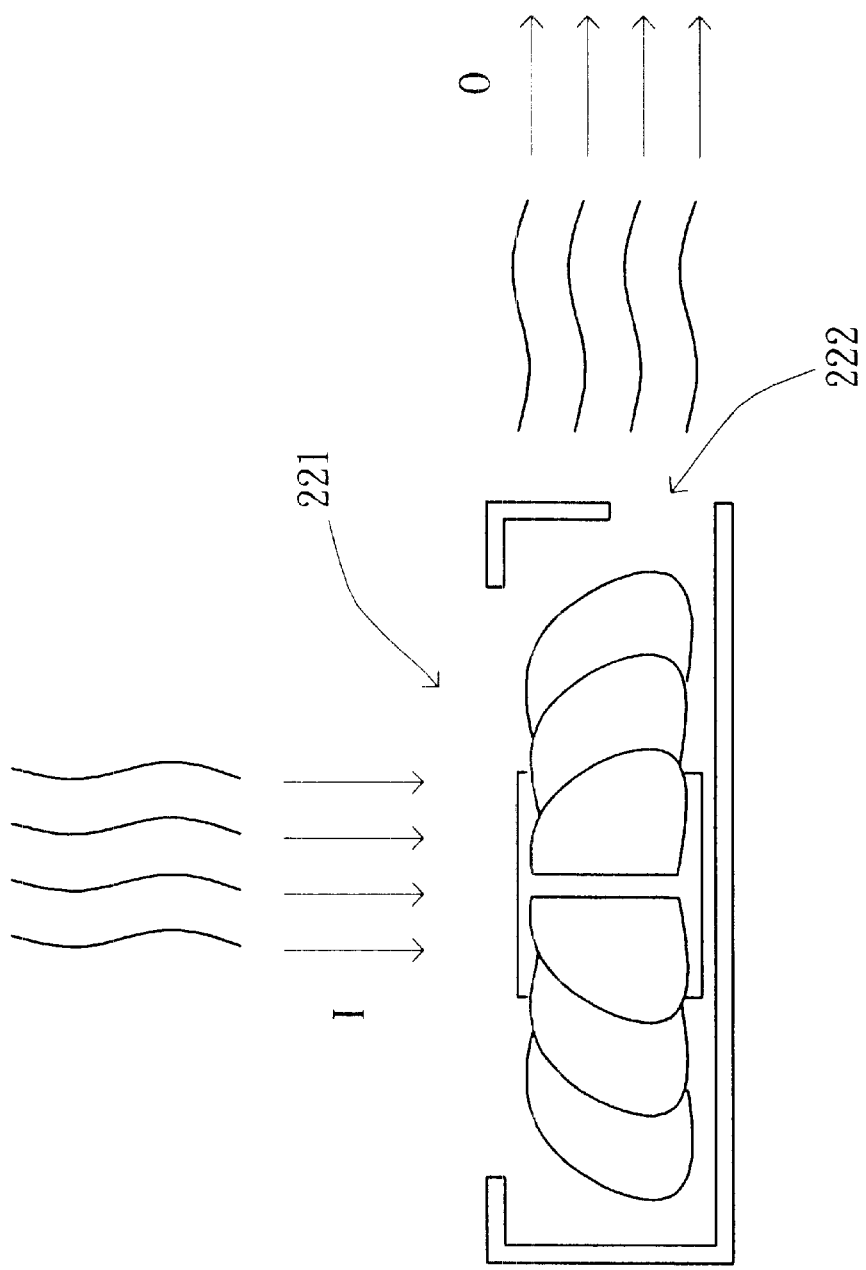
FIG. 2B is a schematic view showing the fan in FIG. 2A.

Referring first to FIG. 2A, a perspective view of a double heat exchange module according to a preferred embodiment of the invention is shown. The double heat exchange module for a portable computer, is applied to cool an integrated circuit within the portable computer. The double heat exchange module includes a thermally conductive structure, a fan 220, and a heat exchanger 230. As shown in FIG. 2A, the thermally conductive structure is preferably a heat pipe 210 with a contact 211. The heat pipe 210 is made of a high thermal conductivity material and disposed within the portable computer. The contact 211 disposed at one end of the heat pipe 210 is coupled with the central processing unit 100 (or other integrated circuits) in order to conduct heat from the integrated circuit so that the heat pipe 210 transfers heat generated by the integrated circuit to the heat exchanger. The fan 220 is also disposed within the portable computer. Referring to FIG. 2B, a schematic view of the fan in FIG. 2A is shown. The fan 220 has an air inlet 221 and air outlet 222, for facilitating airflow from the air inlet 221 to the air outlet 222. The heat exchanger 230 is disposed at the fan 220 and coupled with the heat pipe 210. What is most different from the conventional heat exchanger is the structure and the location thereof. The heat exchanger 230 includes an inflow portion 231 located at the air inlet 221 and an outflow portion 232 located at the air outlet 222. Further, the heat exchanger 230 has a number of fins 240 disposed on the outflow portion 232 and the inflow portion 231 respectively so that the generated heat can be dissipated into the air by fins 240 more efficiently.

The central processing unit 100 generates great operating heat and causes high temperatures while the notebook computer is running. The generated heat is transferred to the heat exchanger 230 by the contact 211 and the heat pipe 210, which are made of high thermal conductivity material. The airflow in the air-in direction I passes through the fins 240 on the inflow portion 231 for the first heat transfer and then enters into the fan 220 from the air inlet 221. Subsequently, the airflow in the air-out direction O exits from the fan 220 from the air outlet 222 and then passes through the fins 240 on the outflow portion 232 for the second heat transfer. Therefore, the generated operating heat can be efficiently dissipated into the air by fins 240.

The double heat exchange module according to the invention has the following advantages:

1. It enhances the heat dissipation efficiency by using double heat transfer, which performs one more time of heat transfer, to increase the heat transfer area in contact with the air.

2. It retains the highly efficient cooling performance of the heat exchange module within the available space.

3. The problem of noise production and the boundary effect of heat dissipation can be avoided, as compared to the designs of increases in fin length or fin density.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A double heat exchange module for a portable computer, which is adapted to cool an integrated circuit within the portable computer, the double heat exchange module comprising:

a thermally conductive structure, disposed within the portable computer and coupled with the integrated circuit, for conducting heat from the integrated circuit;

a fan having a housing, said housing having an air inlet and an air outlet, said fan further having a fan blade disposed within said housing, said fan being disposed within the portable computer, said fan blade being rotatable to cause air to flow into said housing by way of the air inlet and out of said housing by way of the air outlet; and a heat exchanger, disposed on and outside said housing of the fan and being coupled with the thermal conductive structure, for double heat transfer, the heat exchanger comprising:

an inflow portion, located on the air inlet of said housing, so that the air that flows into said housing by way of the air inlet, first passes through the inflow portion; and an outflow portion, located on the air outlet of said housing, so that the air that flows out of said housing by way of the air outlet, subsequently passes through the outflow portion.

2. The double heat exchange module according to claim 1, wherein the thermally conductive structure is made of a high thermal conductivity material.

3. The double heat exchange module according to claim 1, wherein the thermally conductive structure comprises a contact and a heat pipe.

4. The double heat exchange module according to claim 3, wherein the contact is coupled with the integrated circuit for heat transfer.

5. The double heat exchange module according to claim 3, wherein one end of the heat pipe is coupled with the contact and the other end of the heat pipe is coupled with the heat exchanger so that the heat pipe transfers said heat from the contact to the heat exchanger.

6. The double heat exchange module according to claim 1, wherein the heat exchanger has a plurality of fins disposed on the outflow portion, and a plurality of fins disposed on the inflow portion.

7. The double heat exchange module according to claim 1, wherein the integrated circuit is a central processing unit.

* * * * *